(12) United States Patent
Shan (10) Patent No.: US 10,701,797 B2
(45) Date of Patent: Jun. 30, 2020

(54) EMBEDDING DISCRETE COMPONENTS HAVING VARIABLE DIMENSIONS IN A SUBSTRATE

(71) Applicant: International Business Machines Corporation, Armonk, NY (US)

(72) Inventor: Lei Shan, Carmel, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/919,620

(22) Filed: Mar. 13, 2018

(65) Prior Publication Data

US 2018/0206333 A1 Jul. 19, 2018

Related U.S. Application Data

(62) Division of application No. 15/184,125, filed on Jun. 16, 2016, now Pat. No. 9,986,633.

(51) Int. Cl.
*H05K 1/18* (2006.01)
*H05K 1/02* (2006.01)
(Continued)

(52) U.S. Cl.
CPC ........... *H05K 1/0231* (2013.01); *H05K 1/183* (2013.01); *H05K 1/184* (2013.01); *H05K 3/3494* (2013.01);
(Continued)

(58) Field of Classification Search
CPC .................. H05K 1/184; H05K 1/183; H05K 1/182–186; H05K 1/0231; H05K 3/3494; H05K 3/305; H05K 3/3405; H05K 2201/10015; H05K 2203/0156; H05K 2203/1394
See application file for complete search history.

(56) References Cited

U.S. PATENT DOCUMENTS 4,409,608 A    10/1983   Yoder
4,800,459 A *   1/1989   Takagi .............. H01L 23/49822
                                              257/E23.062
(Continued)

OTHER PUBLICATIONS

List of IBM Patents or Patent Applications Treated As Related; Date Filed: Mar. 13, 2018, 2 pages.

*Primary Examiner* — Steven T Sawyer
(74) *Attorney, Agent, or Firm* — Cantor Colburn LLP; Daniel Morris (57) ABSTRACT

Embodiments are directed to a method of embedding a discrete component in a substrate. The method includes forming a cavity in the substrate. The method further includes inserting a discrete component into the cavity, wherein the discrete component comprises a top terminal and a bottom terminal. The method further includes positioning the discrete component within the cavity such that the top terminal is above the bottom terminal and below a front face of the substrate. The method further includes forming an intermediate conductive material within the cavity and over the top terminal. The method further includes forming a top conductive material over the intermediate conductive material such that the top conductive material is electrically coupled through the intermediate conductive material to the top terminal.

6 Claims, 5 Drawing Sheets

(51) Int. Cl.
  *H05K 3/34* (2006.01)
  *H05K 3/30* (2006.01)

(52) U.S. Cl.
  CPC .......... *H05K 3/305* (2013.01); *H05K 3/3405* (2013.01); *H05K 2201/10015* (2013.01); *H05K 2203/0156* (2013.01); *H05K 2203/1394* (2013.01)

(56) References Cited

U.S. PATENT DOCUMENTS

| | | | |
|---|---|---|---|
| 6,136,640 A | 10/2000 | Marty et al. | |
| 6,346,743 B1 | 2/2002 | Figueroa et al. | |
| 6,504,202 B1 | 1/2003 | Allman et al. | |
| 6,706,588 B1 | 3/2004 | Ning | |
| 6,885,544 B2 | 4/2005 | Kim et al. | |
| 7,365,412 B2 | 4/2008 | Dalton et al. | |
| 7,608,484 B2 | 10/2009 | Lange et al. | |
| 7,782,629 B2 | 8/2010 | Graydon et al. | |
| 7,804,678 B2 | 9/2010 | Wu et al. | |
| 8,107,254 B2 | 1/2012 | Bandholz et al. | |
| 8,198,548 B2 | 6/2012 | Hardin et al. | |
| 9,502,490 B2 | 11/2016 | We et al. | |
| 9,585,242 B2 | 2/2017 | Coutts et al. | |
| 2002/0100611 A1* | 8/2002 | Crockett | H05K 1/0231 174/261 |
| 2006/0118931 A1* | 6/2006 | Ho | H01L 23/49822 257/678 |
| 2006/0215379 A1* | 9/2006 | Zollo | H05K 1/184 361/761 |
| 2007/0013068 A1* | 1/2007 | Ranade | H01L 21/4857 257/738 |
| 2010/0078205 A1 | 4/2010 | Sakai et al. | |
| 2010/0112826 A1* | 5/2010 | Frasco | H05K 1/023 439/65 |
| 2010/0246149 A1* | 9/2010 | Nakashima | H01L 23/49827 361/767 |
| 2011/0180312 A1* | 7/2011 | Kim | H05K 1/0231 174/260 |
| 2011/0216513 A1* | 9/2011 | Lee | H05K 1/185 361/761 |
| 2013/0122658 A1* | 5/2013 | Savic | H01L 23/24 438/126 |
| 2017/0290162 A1* | 10/2017 | Gomez | H05K 1/181 |
| 2017/0367176 A1 | 12/2017 | Shan | |

* cited by examiner

EMBEDDING DISCRETE COMPONENTS HAVING VARIABLE DIMENSIONS IN A SUBSTRATE

DOMESTIC PRIORITY

This application is a divisional of U.S. application Ser. No. 15/184,125, filed Jun. 16, 2016, the contents of which are incorporated by reference herein in its entirety.

BACKGROUND

The present disclosure relates in general to managing signal noise in electronic circuits. More specifically, the present disclosure relates to systems, methodologies and resulting structures for efficiently embedding discrete decoupling semiconductor devices (e.g., capacitors) in substrates, cores and/or printed circuit boards (PCBs) to reduce on-package high frequency noise.

As the supply voltages of processor systems (e.g., a central processor unit (CPU)) decrease into the sub-volt range, achieving power integrity is increasingly difficult. For example, in a processor system that uses a 1.2V power supply having +/−5% noise tolerance, a maximum 120 mV peak-to-peak power noise level may be acceptable. However, if the power supply voltage is reduced to 0.9V, the same maximum 120 mV peak-to-peak power noise level now represents a +/−7% variation, which can cause intolerable system errors in many processor system designs.

SUMMARY

Embodiments are directed to a method of embedding discrete components in a substrate. The method includes forming a cavity in the substrate. The method further includes inserting a discrete component into the cavity, wherein the discrete component comprises a top terminal and a bottom terminal. The method further includes positioning the discrete component within the cavity such that the top terminal is above the bottom terminal and below a front face of the substrate. The method further includes forming an intermediate conductive material within the cavity and over the top terminal. The method further includes forming a top conductive material over the intermediate conductive material such that the top conductive material is electrically coupled through the intermediate conductive material to the top terminal.

Embodiments are further directed to a method of embedding a discrete component in a substrate. The method includes forming a cavity in the substrate. The method further includes inserting a discrete component into the cavity, wherein the discrete component comprises a top terminal and a bottom terminal. The method further includes positioning the discrete component within the cavity such that the top terminal is above the bottom terminal and below a front face of the substrate. The method further includes forming an intermediate conductive material within the cavity and over the top terminal. The method further includes forming a top conductive material over the intermediate conductive material such that the top conductive material is electrically coupled through the intermediate conductive material to the top terminal, wherein forming the intermediate conductive material includes depositing a solder paste over the top terminal and reflowing the solder paste to form a reflowed solder material. The cavity includes a top opening extending through a front face of the substrate. The reflowed solder material extends above the front face of the substrate, and forming the intermediate conductive material further comprises planarizing the reflowed solder material.

Embodiments are further directed to a substrate. The substrate includes a cavity formed in the substrate and a discrete component within the cavity, wherein the discrete component comprises a top terminal and a bottom terminal, and wherein the discrete component is positioned within the cavity such that the top terminal is above the bottom terminal and below a front face of the substrate. The substrate further includes an intermediate conductive material within the cavity and over the top terminal. The substrate further includes a top conductive material formed over the intermediate conductive material such that the top conductive material is electrically coupled through the intermediate conductive material to the top terminal.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present disclosure is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the disclosed embodiments, the various elements illustrated in the figures are provided with three or four digit reference numbers. The leftmost digit(s) of each reference number corresponds to the figure in which its element is first illustrated.

DETAILED DESCRIPTION

Although this disclosure includes a detailed description of vertically embedding and making electrical connections to a high-aspect ratio MLC capacitor or other discrete decoupling device, implementation of the teachings recited herein are not necessarily limited to a particular type of discrete component having a particular aspect-ratio. Rather embodiments of the present disclosure are capable of being implemented in conjunction with any other size or type of discrete component (e.g., resistors, inductors, diodes, etc.), now known or later developed. For ease of discussion, the term discrete component is used herein to refer to a variety of device types, including but not limited to passive device such as capacitors, resistors, inductors, and the like, as well as general semiconductor devices.

Various embodiments of the present disclosure are described herein with reference to the related drawings. Alternative embodiments may be devised without departing from the scope of this disclosure. It is noted that various connections and positional relationships (e.g., over, below, adjacent, etc.) are set forth between elements in the following description and in the drawings. These connections and/or positional relationships, unless specified otherwise, may be direct or indirect, and the present disclosure is not intended to be limiting in this respect. Accordingly, a coupling of entities may refer to either a direct or an indirect coupling, and a positional relationship between entities may be a direct or indirect positional relationship. As an example of an indirect positional relationship, references in the present disclosure to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" may be understood to include any integer number greater than or equal to one, i.e. one, two, three, four, etc. The terms "a plurality" may be understood to include any integer number greater than or equal to two, i.e. two, three, four, five, etc. The term "connection" may include both an indirect "connection" and a direct "connection."

Discrete components are used in a variety of electronic and electro-optical applications. ICs are typically formed from various circuit configurations of semiconductor devices formed on semiconductor wafers. Alternatively, semiconductor devices may be formed as monolithic devices, e.g., discrete devices. Semiconductor devices are formed on semiconductor wafers by depositing many types of thin films of material over the semiconductor wafers, patterning the thin films, doping selective regions of the semiconductor wafers, etc. In a conventional semiconductor fabrication process, a large number of semiconductor devices are fabricated in a single wafer.

CMOS (complementary metal-oxide semiconductor) is the semiconductor fabrication technology used in the transistors that are manufactured into most of today's computer microchips. In CMOS technology, both n-type and p-type transistors are used in a complementary way to form a current gate that forms an effective means of electrical control. Processing steps performed later in CMOS technology fabrication sequences are known as back-end-of-line (BEOL) CMOS processing, and processing steps performed earlier in CMOS technology fabrication sequences are known as front-end-of-line (FEOL) CMOS processing. FEOL manufacturing involves the formation of a plurality of die on the surface of a semiconductor wafer. Each semiconductor die is typically identical and contains circuits formed by electrically connecting active and passive components. BEOL manufacturing involves singulating individual semiconductor die from the finished wafer and packaging the die to provide structural support and environmental isolation. The phrase "semiconductor die" as used herein refers to both the singular and plural form of the words, and accordingly can refer to both a single semiconductor device and multiple semiconductor devices.

After completion of device level and interconnect level fabrication processes, the semiconductor devices on the wafer are separated into micro-chips (i.e., chips), and the final product is packaged. IC packaging typically involves encasing the silicon chip(s) inside a hermetically sealed plastic, metal or ceramic package that prevents the chip(s) from being damaged by exposure to dust, moisture or contact with other objects. IC packaging also allows easier connections to a PCB. The purpose of a PCB is to connect ICs and discreet components together to form larger operational circuits. Other parts that can be mounted to the PCB include card sockets, microwave connectors, and the like.

For brevity, conventional techniques related to semiconductor device and IC fabrication may not be described in detail herein. Moreover, the various tasks and process steps described herein may be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that may be utilized in implementing one or more embodiments of the present disclosure will now be provided. Although specific fabrication operations used in implementing one or more embodiments of the present disclosure may be individually known, the disclosed combination of operations and/or resulting structures of the present disclosure are unique. Thus, the unique combination of the operations described in connection with the fabrication of a coupler system according to the present disclosure utilize a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a more detailed description of one or more problems addressed by the present disclosure, as previously noted herein, achieving an acceptable level of power integrity is increasingly difficult as the supply voltages of processor systems decrease into the sub-volt range. For example, in a processor system that uses a 1.2V power supply having +/−5% noise tolerance, a maximum 120 mV peak-to-peak power noise level may be acceptable. However, if the power supply voltage is reduced down to 0.9V, the same maximum 120 mV peak-to-peak power noise level now represents a +/−7% variation, which can cause intolerable errors in many processor systems.

Capacitors are often used to filter undesired noise from power supplies. When used in this manner, such capacitors are often referred to as decoupling capacitors. In operation, a decoupling capacitor is used to decouple one part of an electrical circuit from another. Noise caused by other circuit elements is shunted through the capacitor, which reduces the impact such noise can have on the rest of the circuit.

As electronic components find growing applications in consumer electronics products, it is desirable to embed electronic components within substrates, cores and/or PCBs. Because the majority of electronic components in circuits are passive (e.g., capacitors, resistors, inductors, etc.), integration of embedded passive components within the silicon substrate/core/PCB enables high package density with high performance. In addition to noise suppression, embedded capacitors have applications in a variety of electronic functions such as decoupling, switching noise suppression, bypass filtering, ac/dc conversion, and signal termination.

Figure 1:
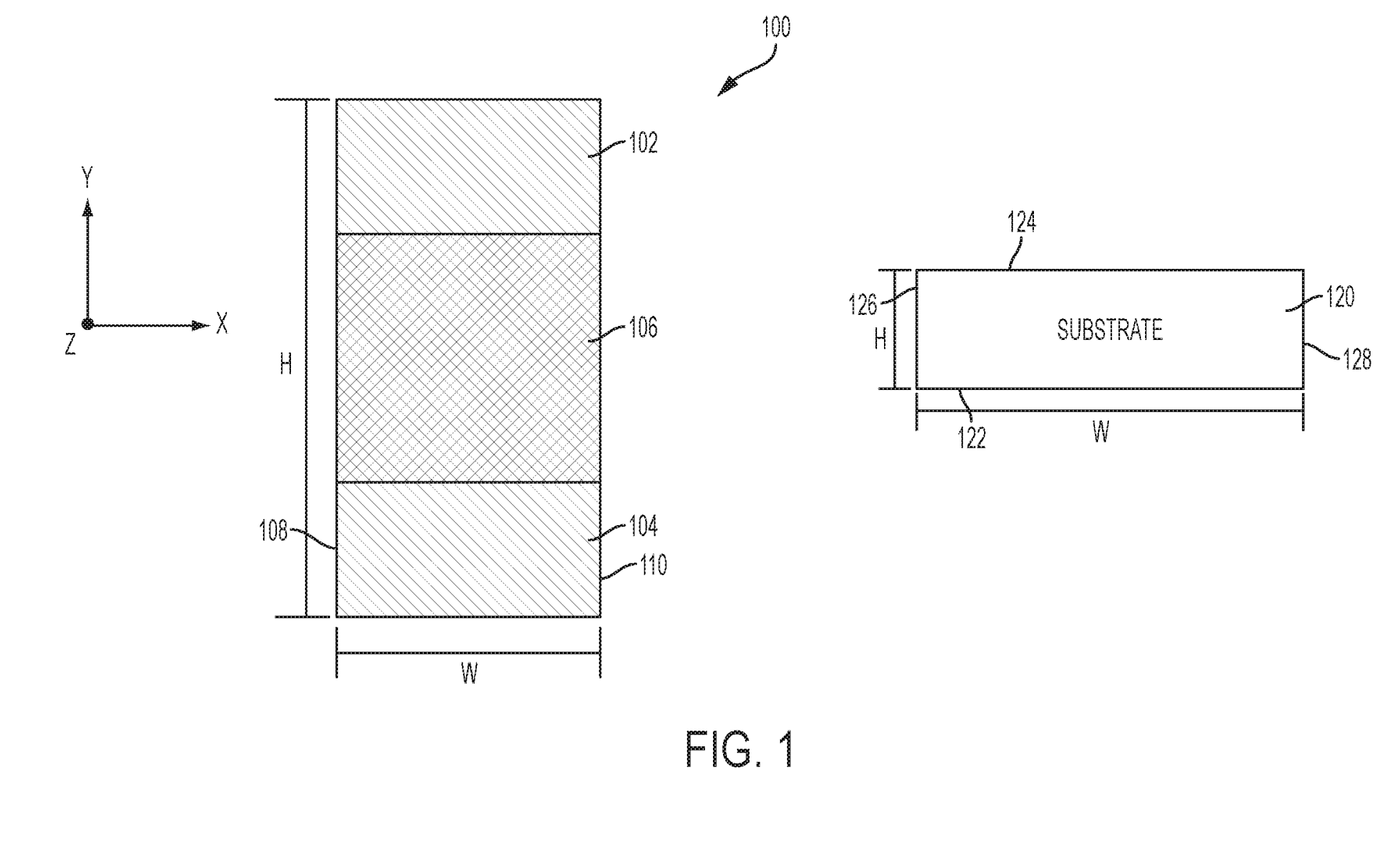
FIG. 1 depicts a schematic diagram of a substrate/core/PCB and a multi-layer ceramic (MLC) capacitor, wherein the MLC capacitor is in a vertical position with respect to the substrate/core/PCB, and wherein the MLC capacitor is one example of a discrete component or a semiconductor device capable of being vertically embedded in a substrate/core/PCB according to one or more embodiments of the present disclosure.

The ability to embed discrete capacitive electronic components has been facilitated by the development of MLC capacitors (also known as chip capacitors) and via technology. FIG. 1 depicts a schematic diagram of a substrate/core/PCB 120 and an MLC capacitor 100. MLC capacitor 100 is one example of a discrete component capable of being vertically embedded in substrate/core/PCB 120 according to one or more embodiments of the present disclosure. In general, an MLC capacitor is a fixed value capacitor in which layers of ceramic material act as the dielectric. MLC capacitor 100 depicts a known configuration having a main body 106 formed from multiple ceramic layers, which are also referred to as the ceramic stack. Metal layers above and below the ceramic stack form a top terminal 102 and a bottom terminal 104 of MLC capacitor 100.

Substrate/core/PCB 120 may be implemented as a solid substrate body, a multi-layered laminated core, a PCB, or similar structures. For ease of reference, substrate/core/PCB 120 may be referred to in the present disclosure as substrate 120. However, it is intended that any descriptions provided herein that apply to substrate 120 apply as well to all implementations of substrate 120, including, for example a solid substrate body, a multi-layered laminated core, a PCB, or similar structures.

To provide directional references for substrate 120 and MLC capacitor 100, FIG. 1 also depicts a diagram of an X-axis, a Y-axis and a Z-axis. The X-axis extends horizontally from left to right (and vice versa) on the page. The Y-axis extends vertically from bottom to top (and vice versa) of the page. The Z-axis extends into and out of the page. As used in the present disclosure, the phrase "horizontal direction" and/or the term "horizontally" refer to a direction on substrate 120 and/or MLC capacitor 100 extending along the X-axis. Additionally, the phrase "vertical direction" and/or the term "vertically" refer to a direction on substrate 120 and/or MLC capacitor 100 extending along the Y-axis.

As shown in FIG. 1, substrate 120 includes a height (H) dimension and a width (W) dimension. The H dimension of substrate 120 extends from a back face 122 of substrate 120 to a front face 124 of substrate 120 (and vice versa). Accordingly, the H dimension of substrate 120 extends vertically along the Y-axis. The W dimension of substrate 120 extends from a leftmost end 126 of substrate 120 to a rightmost end 128 of substrate 120 (and vice versa). Accordingly, the W dimension of substrate 120 extends horizontally along the X-axis.

As also shown in FIG. 1, MLC capacitor 100 includes a height (H) dimension and a width (W) dimension. The H dimension of MLC capacitor 100 extends from bottom terminal 104 to top terminal 102 (and vice versa). Accordingly, the H dimension of MLC capacitor 100 extends vertically along the Y-axis. The W dimension of MLC capacitor 100 extends from a leftmost end 108 to a rightmost end 110 of bottom terminal 104. Accordingly, the W dimension of MLC capacitor 100 extends horizontally along the X-axis. Accordingly, MLC capacitor 100 is in a vertical position with respect to substrate 120 in that the H dimension of MLC capacitor 100 and the H dimension of substrate 120 both extend along the Y-axis.

In practice, the dimensions (e.g., the H dimension) of MLC capacitor 100 are inconsistent from one MLC capacitor to the next. This is primarily due to the way MLC capacitors are fabricated, wherein relatively imprecise and difficult to control cutting instruments are used to form the final MLC capacitor structure. Similar dimension variability is found in other non-capacitor devices. Additionally, MLC capacitors are often manufactured having high aspect ratios (i.e., height>width). For example, the H dimension of MLC 100 shown in FIG. 1 is typically about 600 microns, and the W dimension of MCL 100 is typically about 300 microns. A typical value of MLC capacitor 100 is about 1 µF. The overall shape of MLC capacitor 100 may cylindrical, rectangular, or any other shape.

It is a goal in semiconductor manufacturing to fit more and smaller devices within a given area of the semiconductor die. Fitting more semiconductor devices on the semiconductor die increases density. Accordingly, the footprint of each device on a semiconductor wafer is closely managed. Because the dimensions, particularly the H dimension, of MLC capacitors are inconsistent from one MLC capacitor to the next, known methods of embedding MLC capacitors in substrates place the MLC capacitor such that the H dimension of the MLC capacitor extends horizontally along the X-axis.

However, horizontal placement of MLC capacitors has shortcomings. Known horizontal placement techniques require complex fabrication operations, which result in low yield and high cost. Horizontal placement of high aspect ratio capacitors results in a larger device footprint, which requires significant changes and/or modifications to the package design. Changing the package design not only introduces an additional work load, but also involves via removal and has a negative influence on current capacity. Horizontal placement also results in complex and long paths to IC connections, which introduces large loop inductance and reduces power decoupling effectiveness.

Turning now to an overview of the present disclosure, one or more embodiments provide systems, methodologies and resulting structures for efficiently embedding discrete decoupling devices (e.g., capacitors) in a substrate (e.g., a solid substrate, a laminated substrate core, a PCB, etc.) to reduce on-package high frequency noise. In one or more embodiments, the discrete components are high-aspect ratio (i.e., H>W) devices having a top terminal and a bottom terminal, wherein the top terminal is above the bottom terminal along the Y-axis. The discrete components are embedded in the substrate vertically such that the H dimension of the discrete component and the H dimension of the substrate both extend along the Y-axis.

According to the present disclosure, the H dimension of the substrate is selected to be greater than the H dimension of the discrete component. Accordingly, the top terminal of the vertically embedded discrete component is below a front face of the substrate. To compensate for variability in the H dimension of the discrete components, the present disclosure provides simple and efficient methodologies for, in effect, extending the H dimension of the top terminal to meet the front face of the substrate, and then electrically coupling the top and bottom terminals to conductive plating/interconnect layers that extend along the front face and the back face. In one more embodiments, the electrical coupling between the extended top terminal and one of the conductive plating/interconnect layers is direct without the need for complicated intervening electrical coupling structures (e.g., conductive vias). Similarly, in one more embodiments, the electrical coupling between the bottom terminal and one of the conductive plating/interconnect layers is direct without the need for complicated intervening electrical coupling structures (e.g., conductive vias). Accordingly, vertically embedding a decoupling device according to the present disclosure efficiently and effectively avoids the above-described shortcomings (e.g., larger device footprint, complex and long paths to IC connections, increased loop inductance, reduced power decoupling, etc.) of horizontally embedding such decoupling devices.

Figure 2A:
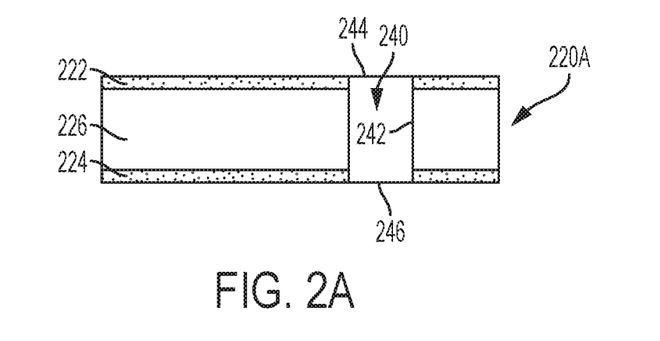
FIG. 2A depicts a cross-sectional view of a substrate/core/PCB after initial vertical embedding operations according to one or more embodiments.

Turning now to a more detailed description of one or more embodiments, a fabrication methodology for forming a substrate having vertically embedded discrete components according to the present disclosure will now be described with reference to FIGS. 2A-3. More specifically, FIGS. 2A-2F illustrate substrate structures 220A, 220B, 220C, 220D, 220E, 220F after various fabrication stages, and FIG. 3 depicts the operations of a fabrication methodology 300 that correspond to the fabrication stages shown in FIGS. 2A-2F. The following description will refer simultaneously to both the fabrication stages depicted in FIGS. 2A-2F and the corresponding operation(s) of methodology 300 depicted in FIG. 3. It is noted that substrates 220A, 220B, 220C, 220D, 220E, 220F shown in FIGS. 2A-2F are greatly simplified for ease of illustration and description. In practice, a substrate embodying the present disclosure may include multiple substrate configurations, including, for example, multiple layers of substrates, two-dimensional (2D) substrate configurations, three-dimensional (3D) substrate configurations, etc.

FIG. 2A depicts a cross-sectional view of substrate 220A after an initial fabrication stage according to one or more embodiments. Substrate 220A includes multiple layers, namely a front face layer 222, a back face layer 224, and a substrate body 226, all formed using known substrate fabrication techniques (e.g., lamination, etc.). A cavity 240 having an interior sidewall 242, a front face opening 244 and a back face opening 246 is formed through substrate 220A (block 302) using conventional techniques such as drilling.

Figure 2B:
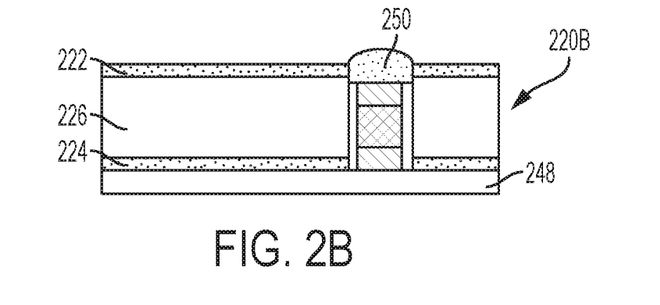
FIG. 2B depicts a cross-sectional view of the substrate/core/PCB after additional vertical embedding operations according to one or more embodiments.
Figure 3:
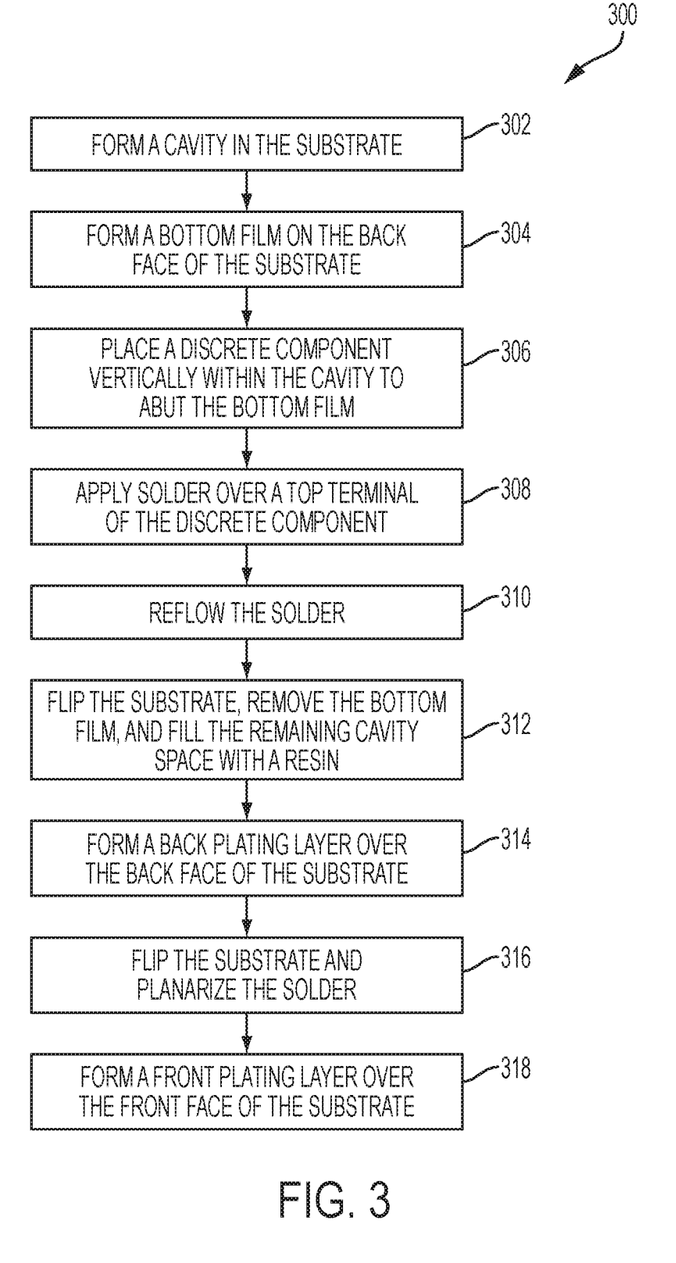
FIG. 3 depicts a flow diagram illustrating a vertical embedding methodology according to one or more embodiments.

In FIG. 2B, a film layer 248 is formed under/on back face layer 224 (block 304), and MLC capacitor 100 is placed vertically within cavity 240 (block 306) until bottom terminal 104 contacts film layer 248. In one or more embodiments, film layer 248 may be formed from a sticky material such that MLC capacitor 100 remains in place once contact is made between bottom terminal 104 and film layer 248. In accordance with the present disclosure, the H dimension of substrate 220B is selected to be greater than the H dimension of MLC capacitor 100, taking into account the expected range of variability in the H dimension of MLC capacitor 100. Additionally, the W dimension of cavity 240 is selected to be greater than the W dimension of MLC capacitor, taking into account the expected range of variability, if any, in the W dimension of MLC capacitor 100. Accordingly, when MLC capacitor 100 is vertically and completely placed within cavity 240, top terminal 102 of the vertically placed MLC capacitor 100 is always below front face layer 222.

To compensate for variability in the H dimension of MLC capacitor 100, solder 250 (e.g., Indium (In)/In-alloys and flux) is applied to top terminal 102 and reflowed (blocks 308 and 310). In an exemplary reflow process, solder 250 is subjected to controlled heat, which melts at least solder 250, thereby permanently attaching solder 250 to top terminal 102, and providing electronic coupling to top terminal 102. In one or more embodiments, sufficient solder 250 may be applied to substantially cover a top surface of top terminal 102 cover. Additionally, in one or more embodiments, sufficient solder 250 is applied to top terminal 104 to substantially fill front face opening 244 of cavity 240. Heating may be accomplished by substrate 220B through a reflow oven or under an infrared lamp or by application of a hot air pencil to the solder paste that forms solder 250. The reflow process melts at least solder 250 and heats the adjoining surfaces without overheating and damaging the electrical components. An exemplary reflow process includes four stages or zones, namely preheat, thermal soak, reflow and cooling, wherein each stage has a distinct thermal profile. An exemplary reflow process is conducted in an acid environment using, for example, formic acid. The acid environment ensures that the solder remains clean during reflow. After the reflow process is complete, the solder/top-terminal stack (248, 104) are physically and electrically coupled such that the effective H dimension of MLC capacitor 100 is such that the solder/top-terminal stack (248, 104) extends above front face layer 222 of substrate 220A.

Figure 2C:
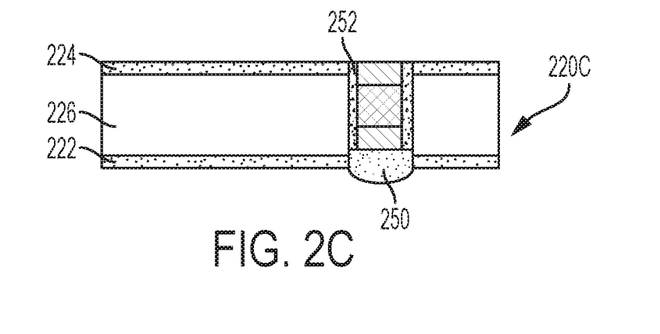
FIG. 2C depicts a cross-sectional view of the substrate/core/PCB after additional vertical embedding operations according to one or more embodiments.

In FIG. 2C, substrate 220C has been flipped over, and film layer 248 has been removed (block 312). A fill material such as a resin 252 is applied through bottom face opening 246 to substantially fill the space between MLC capacitor 100 and interior sidewall 242 of cavity 240 (block 312). Sufficient resin is applied to minimize or eliminate air pockets from the space between MLC capacitor 100 and interior sidewall 242 of cavity 240.

Figure 2D:
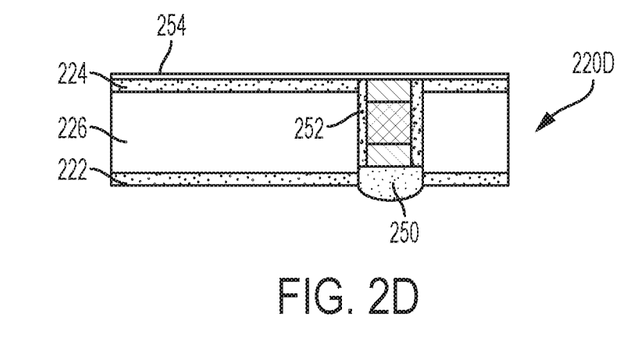
FIG. 2D depicts a cross-sectional view of the substrate/core/PCB after additional vertical embedding operations according to one or more embodiments.
Figure 2E:
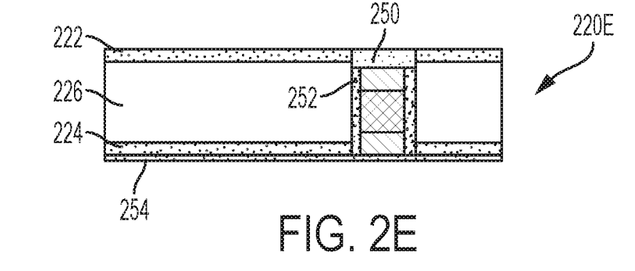
FIG. 2E depicts a cross-sectional view of the substrate/core/PCB after additional vertical embedding operations according to one or more embodiments.

In FIG. 2D, a back plating layer 254 is formed over back face layer 224 (block 314). Back plating layer 254 may be implemented as a copper (Cu) material and provides electrical coupling to bottom terminal 104. Back plating layer 254 may take a variety of forms including, for example, a ground plane, a power plane, a partial plane, or a full plane. In general, back plating layer 254 may be electrically coupled through and a part of an interconnect layer structure. In general, the interconnect layer structure serves as the streets and highways of the IC that will ultimately connect all circuit elements (not shown) formed on substrate 220D into a functioning whole and to the outside world. Interconnect levels (or metal layers) vary in numbers depending on the complexity of the device.

In FIG. 2E, substrate 220E is again flipped, and excess reflowed solder is removed by planarizing solder 248 (e.g., using chemical mechanical polishing (CMP)) until a top surface of solder 248 is substantially planar with front face layer 222 (block 316).

Figure 2F:
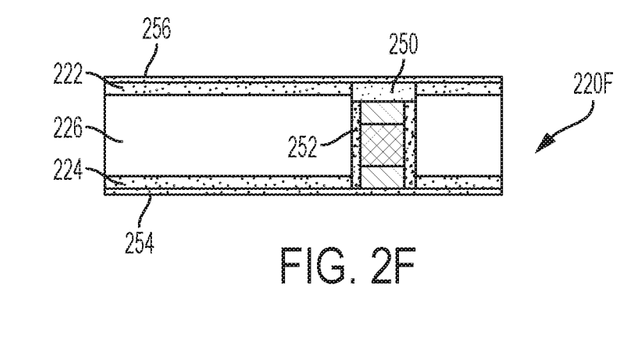
FIG. 2F depicts a cross-sectional view of the substrate/core/PCB after additional vertical embedding operation according to one or more embodiments.

In FIG. 2F, a front plating layer 256 is formed over front face layer 222 (block 318). Front plating layer 256 may be implemented as a copper (Cu) material and provides electrical coupling to top terminal 102. Front plating layer 256 may take a variety of forms including, for example, a ground plane, a power plane, a partial plane, or a full plane. In general, front plating layer 256 may be electrically coupled through and a part of an interconnect layer structure. In general, the interconnect layer structure serves as the streets and highways of the IC that will ultimately connect all circuit elements (not shown) formed on substrate 220F into a functioning whole and to the outside world. Interconnect levels (or metal layers) vary in numbers depending on the complexity of the device.

Figure 4:
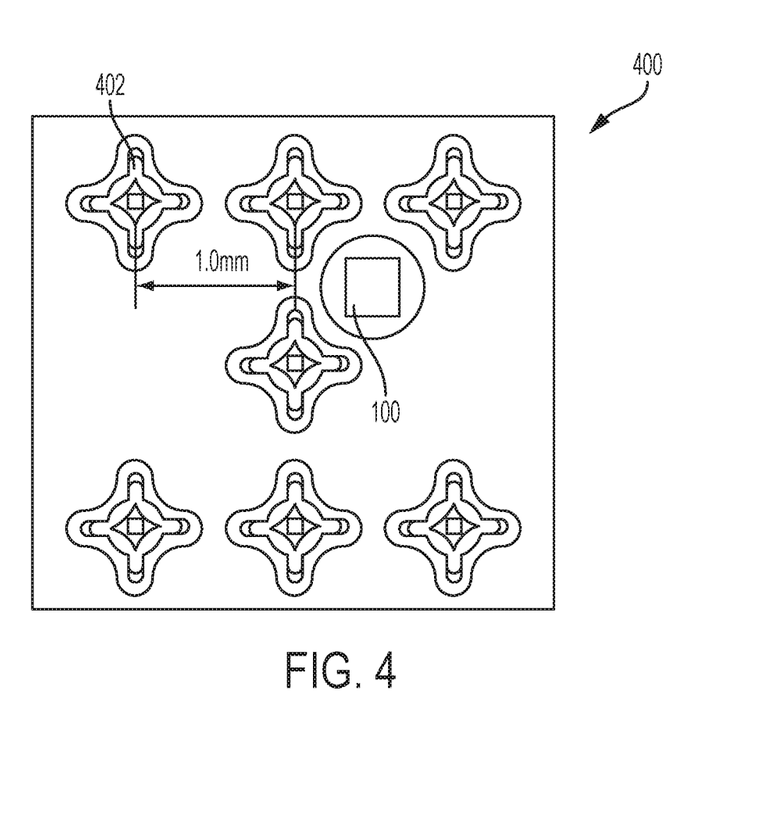
FIG. 4 depicts a top-down view of a substrate/core/PCB having a vertically embedded discrete component or semiconductor device according to one or more embodiments.

FIG. 4 depicts a top-down view of a substrate 400 having a vertically embedded MLC capacitor 100 according to one or more embodiments. In the example shown in FIG. 4, the pitch (i.e., the center-to-center distance between features 402, only one of which is provided with a reference number for ease of reference) of the circuit design is about 1 millimeter (mm) or 1000 microns. Accordingly, utilizing the vertical embedding methodologies of the present disclosure, an MLC capacitor 100 having a W dimension of approximately 300 microns or 0.30 mm allows MLC capacitor 100 to fit easily within the existing 1 mm pitch circuit design without having to modify the circuit design.

Figure 5:
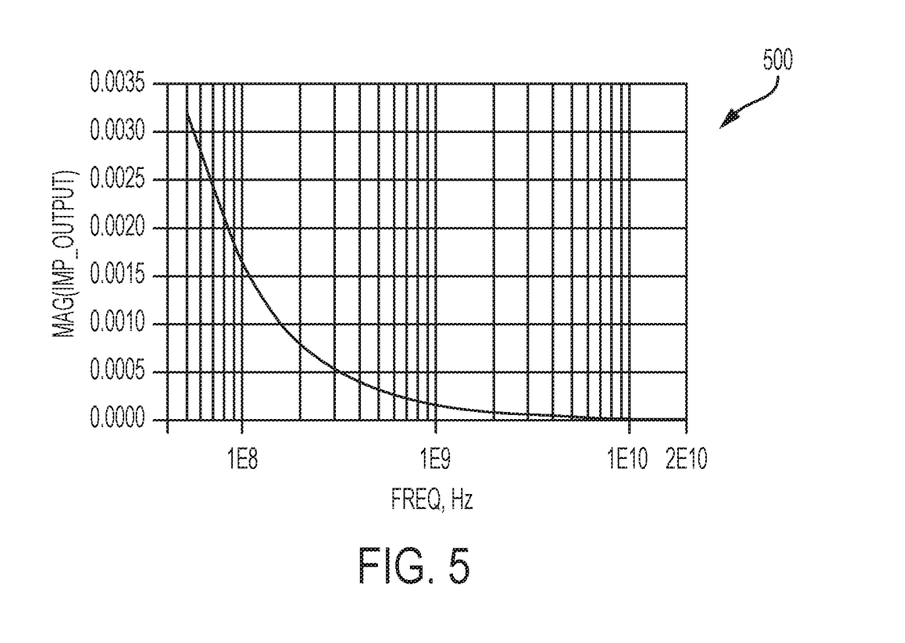
FIG. 5 depicts a graph illustrating the input impedance vs. frequency for an ideal capacitor that has been horizontally placed within a substrate/core/PCB.
Figure 6:
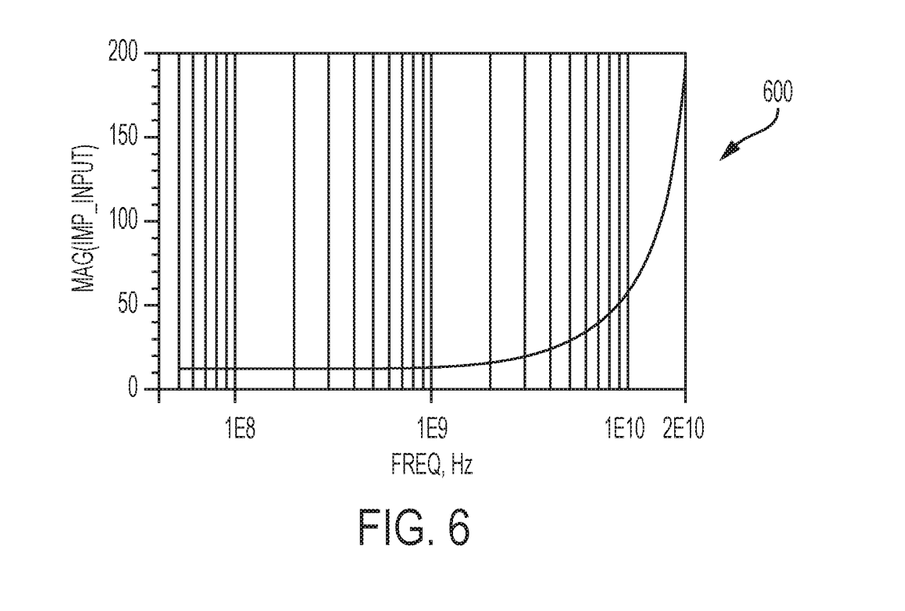
FIG. 6 depicts a graph illustrating the output impedance vs. frequency for an ideal capacitor that has been vertically placed within a substrate/core according to one or more embodiments.

FIG. 5 depicts a graph 500 illustrating the input impedance vs. frequency for an ideal capacitor that has been horizontally placed within a substrate/core/PCB. FIG. 6 depicts a graph 600 illustrating the output impedance vs. frequency for an ideal capacitor that has been vertically placed within a substrate/core according to one or more embodiments. A shown by graphs 500, 600, vertical placement results in less inductance than vertical placement, which means that vertical placement provides significantly lower impedance than horizontal placement. In horizontal placement, because the impedance can be relatively high, the decoupling capacitor can perform more like an inductor than a capacitor, which compromises the effectiveness of any power decoupling tasks performed by the horizontally placed capacitor.

Thus, it can be seen from the foregoing detailed description and accompanying illustrations that one or more embodiments provide systems, methodologies and resulting structures for efficiently embedding discrete decoupling devices (e.g., capacitors) in a substrate (e.g., a solid substrate, a laminated substrate core, a PCB, etc.) to reduce on-package high frequency noise. As disclosed herein, discrete decoupling capacitors are embedded in laminate substrates and/or PCBs as a cost-effective substitution to on-chip decoupling capacitance with an added benefit of subsiding on-package high frequency noise. The disclosed methodologies and structures are compatible with standard lamination processes and may be applied to either substrate cores or PCBs. The capacitors are vertically embedded in a novel manner that allows their terminals to be directly connected to copper planes to substantially mitigate loop inductance. Accordingly, vertically embedding a discrete component or semiconductor device according to the present disclosure efficiently and effectively avoids the above-described shortcomings (e.g., larger device footprint, complex and long paths to IC connections, increased loop inductance, reduced power decoupling, etc.) of horizontally embedding such discrete components.

In some embodiments, various functions or acts may take place at a given location and/or in connection with the operation of one or more apparatuses or systems. In some embodiments, a portion of a given function or act may be performed at a first device or location, and the remainder of the function or act may be performed at one or more additional devices or locations.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The flowchart and block diagrams in the figures illustrate the functionality and operation of possible implementations of systems and methods according to various embodiments of the present disclosure. In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. The actions may be performed in a differing order or actions may be added, deleted or modified. Also, the term "coupled" describes having a signal path between two elements and does not imply a direct connection between the elements with no intervening elements/connections therebetween. All of these variations are considered a part of the disclosure.

The term "about" is intended to include the degree of error associated with measurement of the particular quantity based upon the equipment available at the time of filing the application. For example, "about" can include a range of ±8% or 5%, or 2% of a given value.

The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

What is claimed is:

1. A multi-layered substrate comprising:
   a substrate body;
   a front face layer formed on a front face of the substrate body;
   a back faced layer formed on a back face of the substrate body;
   a cavity formed in the multi-layered substrate;
   wherein the cavity extends from the front face layer of the multi-layered substrate through the substrate body to the back face layer of the multi-layered substrate;
   wherein the cavity comprises a cavity width dimension and a cavity height dimension;
   wherein the cavity width dimension is less than the cavity height dimension; and
   a discrete component within the cavity;
   wherein the discrete component comprises a discrete component width dimension and a discrete component height dimension;
   wherein the discrete component width dimension is less than the discrete component height dimension;
   wherein the cavity width dimension is less than the discrete component height dimension;
   wherein the discrete component comprises a multi-layered top terminal and a bottom terminal;
   wherein the multi-layered top terminal comprises a first top terminal layer and a second top terminal layer;
   wherein the discrete component is positioned within the cavity such that the multi-layered top terminal is above the bottom terminal and such that a top surface of the second top terminal layer is below the front face layer of the multi-layered substrate;
   wherein the discrete component is further positioned within the cavity such that a top surface of the first top terminal layer is substantially planar with respect to a top surface of the front face layer of the multi-layered substrate;
   wherein a width dimension of the first top terminal layer is greater than a width dimension of the second top terminal layer;
   wherein the first top terminal layer fills in a top opening of the cavity; and
   a top conductive material formed over the first top terminal layer such that the top conductive material is electrically coupled through the first top terminal layer to the second top terminal layer;
   wherein the discrete component is positioned within the cavity such that a bottom surface of the bottom terminal is substantially planar with respect to a bottom surface of the back face layer of the multi-layered substrate;
   wherein the cavity further comprises a bottom conductive portion; and
   wherein the discrete component is further positioned within the cavity such that the bottom terminal of the discrete component is electrically coupled to the bottom conductive portion of the cavity.

2. The multi-layered substrate of claim 1, wherein the first top terminal layer comprises a solder material.

3. The multi-layered substrate of claim 2, wherein:
   the cavity comprises the top opening of the cavity extending through the front face layer of the multi-layered substrate; and
   the solder material is at least between the second top terminal layer and the front face layer of the multi-layered substrate.

4. The multi-layered substrate of claim 1 further comprising a bottom layer of conductive material on the back face layer of the multi-layered substrate.

5. The multi-layered substrate of claim 4, wherein:
   a portion of the bottom layer of conductive material covers a bottom opening of the cavity; and
   the bottom portion of the cavity comprises the portion of the bottom layer of conductive material that covers the bottom opening.

6. The multi-layered substrate of claim 1 further comprising a filler material in a space between the discrete component and a sidewall surface of the cavity.

* * * * *